US009032353B2

(12) United States Patent
Tsai (10) Patent No.: US 9,032,353 B2
(45) Date of Patent: May 12, 2015

(54) METHOD AND SYSTEM FOR THREE-DIMENSIONAL LAYOUT DESIGN OF INTEGRATED CIRCUIT ELEMENTS IN STACKED CMOS

(71) Applicant: Taiwan Semiconductor Manufacturing Co., Ltd., Hsin-Chu (TW)

(72) Inventor: Chien-Chun Tsai, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/050,400

(22) Filed: Oct. 10, 2013

(65) Prior Publication Data

US 2015/0106777 A1   Apr. 16, 2015

(51) Int. Cl.
*G06F 17/50* (2006.01)
(52) U.S. Cl.
CPC .................................. *G06F 17/5072* (2013.01)
(58) Field of Classification Search
USPC ......................................................... 716/119
See application file for complete search history.

(56) References Cited

U.S. PATENT DOCUMENTS

| 6,477,696 | B2 | 11/2002 | Tien | |
| 6,513,148 | B1 * | 1/2003 | Gasanov et al. | 716/104 |
| 7,155,686 | B2 | 12/2006 | Hou et al. | |
| 2007/0277136 | A1 * | 11/2007 | Ueda et al. | 716/8 |
| 2010/0005437 | A1 * | 1/2010 | McIlrath | 716/10 |
| 2011/0095367 | A1 * | 4/2011 | Su et al. | 257/355 |
| 2011/0314437 | A1 * | 12/2011 | McIlrath | 716/139 |
| 2012/0227018 | A1 * | 9/2012 | Chih et al. | 716/55 |
| 2012/0278781 | A1 * | 11/2012 | Wann et al. | 716/122 |
| 2013/0120951 | A1 | 5/2013 | Zuo et al. | |

* cited by examiner

*Primary Examiner* — Suresh Memula
(74) *Attorney, Agent, or Firm* — Duane Morris LLP (57) ABSTRACT

A method includes providing a design of a semiconductor device such as a stacked CMOS device comprising a plurality of circuit elements to be assigned into a layout of a plurality of tiers, and identifying at least one first type of circuit element within the plurality of circuit elements based on at least one predetermined criterion. Each respective one of the at least one first type of circuit element is to be assigned to a respective designated one of the plurality of tiers. The method further includes dividing the remainder of the plurality of circuit elements into at least two groups of circuit elements based on circuit density, and assigning the at least one first type of circuit element and the at least two groups of circuit elements to respectively different ones of the plurality of tiers of the semiconductor device.

20 Claims, 7 Drawing Sheets

METHOD AND SYSTEM FOR THREE-DIMENSIONAL LAYOUT DESIGN OF INTEGRATED CIRCUIT ELEMENTS IN STACKED CMOS

FIELD

The disclosed method and system relate to integrated circuits (IC). More particularly, the disclosed subject matter relates to layouts of IC structures in stacked CMOS (complementary metal-oxide-semiconductor) and 3D-IC devices.

BACKGROUND

Developments in integrated circuit technology have often focused on improving the integration density of various electronic components, such as transistors, capacitors, diodes, resistors, and inductors, into a given chip or wafer area. Various improvements have involved the reduction of minimum component size, permitting more components to be integrated on the surface of the semiconductor die. Such two-dimensional (2D) integration density improvements are physically limited by device size, the size of the die, and other limitations including the complexity of design, such as, for example, the requisite length and number of interconnections between devices, and the corresponding circuit delay and power consumption increases.

Three-dimensional integrated circuits (3D-IC) and stacked wafers or dies are used to resolve some of the limitations of 2D integrated circuits. Plural dies are stacked vertically within a single package and electrically connected to each other. Through substrate vias (also referred to as through silicon vias), TSVs, are often used in stacked wafer/die packaging structures to connect the wafers or dies in 3D-IC structures. TSVs are vertical openings passing completely though semiconductor substrates and filled with conductive material to provide connections between stacked wafers or dies, or between front and back surfaces of a die. The total interconnect length of the integrated circuits has been found to decrease as the number of dies or wafers increased in the 3D stack.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Stacked CMOS structures comprise circuit elements placed three dimensionally in multiple tiers (or layers). Each tier has a respective semiconductors substrate or semiconductor layer, and a respective interconnect structure above the semiconductor substrate or semiconductor layer. Inter-level vias (ILVs), shorter and smaller in diameter than TSVs, are used to connect the circuit elements in different tiers from each other.

For brevity, references to "circuit density" made below will be understood to encompass the density of circuit elements in a layout of a semiconductor integrated circuit unless expressly indicated otherwise. For example, in some embodiments, the circuit density is represented by at least one of a density of polysilicon (used in the gate electrode layer, for example) and a density of active regions. The density of polysilicon is defined by a percentage of areas of polysilicon occupied in a unit area of a respective tier or layer. The density of active regions is defined by a percentage of active regions occupied in a unit area of a respective tier or layer. In some embodiments, the circuit density includes both a density of polysilicon and a density of active regions.

Different types of circuit elements have varied circuit density. Within one layer of an integrated circuit, smaller gradient in circuit density of neighboring circuit elements is desired for device uniformity during fabrication and device performance.

In a two-dimensional (2D) layout of a semiconductor device, the blocks of the significant circuits having high speed or high precision specifications generally have moderate circuit density, for example, in the range of from 20% to 40%. Some circuit elements, for example, a de-coupling capacitor circuit, in the same layer may have a circuit density as high as 60%. Some other circuit elements, for example, a high resistance (Hi-R) resistor, in the same layer may have a circuit density lower than 10%. Either the circuit elements having high circuit density or the circuit elements having low circuit density, when placed adjacent to a significant circuit such as a timing sensitive circuit can cause undesired decreases in performance. To minimize such an adverse impact, dummy circuit elements similar to the timing sensitive circuit elements are placed around the timing sensitive circuit elements to reduce the circuit density gradients.

Figure 1A:
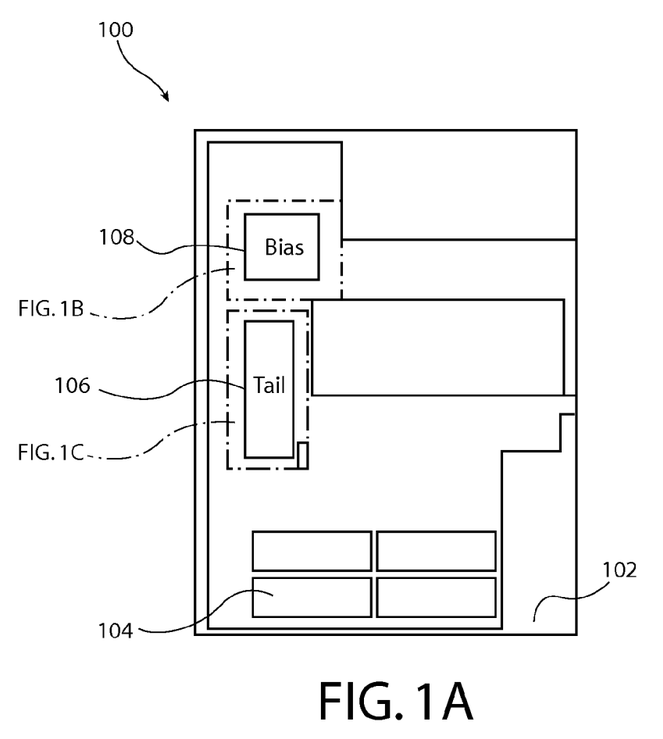
FIG. 1A illustrates a top-down view of a two-dimensional layout of a semiconductor device.

FIG. 1A illustrates a two-dimensional layout 100 of a semiconductor device in some embodiments. Layout 100 is based on a continuous time linear equalizer (CTLE) device. In the same layer 102, layout 100 comprises significant circuit elements 106 and 108 having moderate circuit density, and some circuit elements 104 having a circuit density higher or lower than those of significant circuit elements 106 and 108. As shown in FIG. 1A, significant circuit elements 106 and 108 are a bias circuit block and a tail current circuit block, respectively.

Figure 1B:
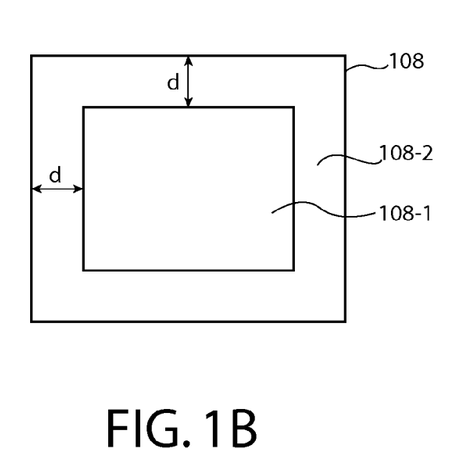
FIGS. 1B and 1C are enlarged view of two portions of active regions in two-dimensional layout of FIG. 1A.
Figure 1C:
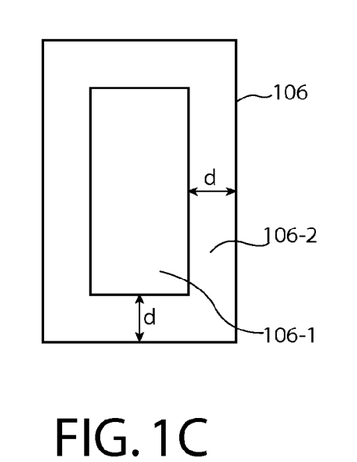

As shown in FIGS. 1B and 1C, each block of the significant circuit elements 106 and 108 comprises an active region 106-1 or 108-1. Dummy circuits (not shown in FIGS. 1B and 1C), which are similar or identical to the circuits (not shown) in an active region 106-1 or 108-1, are generally built in the area 106-2 or 108-2 surrounding the active region 106-1 or 108-1 to reduce the circuit density gradient. The area 106-2 or 108-2 extends beyond each side of the active region 106-1 or 108-1 by a width (d).

However, the use of dummy circuits increases the size of the device and the length of interconnects, thus reducing the speed and increasing the power of resulting devices.

The circuit placement in layout design becomes more important when the process technology migrates to smaller geometries, such as the 28 nm technology node, the 20 nm technology node, or the like. This disclosure provides a method and a system for designing a layout three-dimensionally in a semiconductor device such as a stacked CMOS device or a 3D-IC device.

Figure 2:
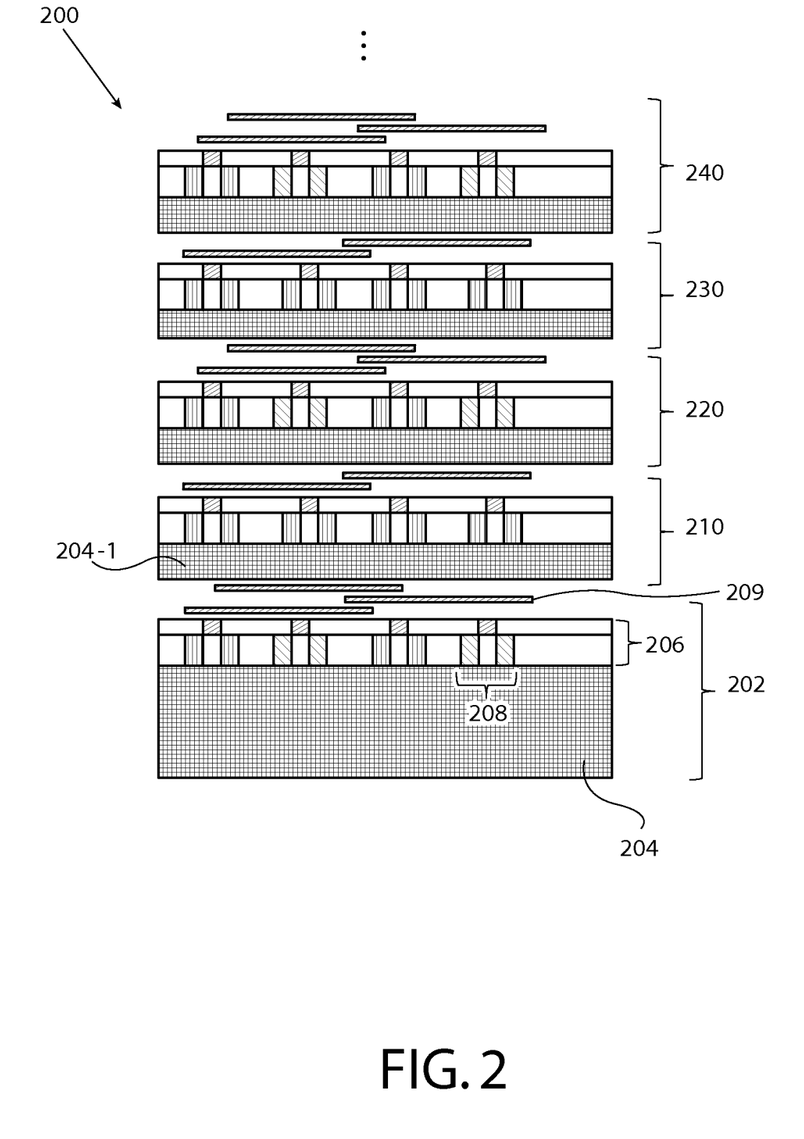
FIGS. 2-4 are cross-sectional views illustrating exemplary three-dimensional layouts of three stacked CMOS devices in accordance with some embodiments.
Figure 3:
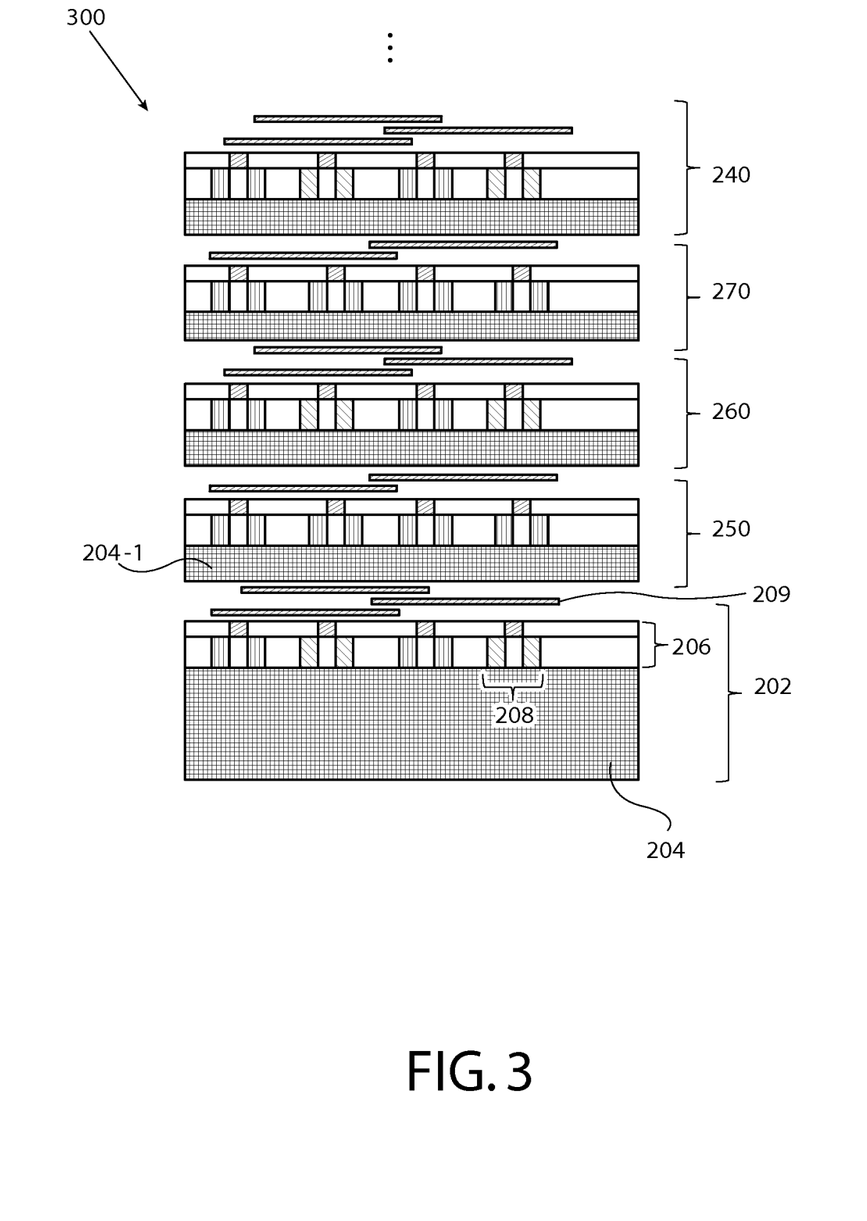
Figure 4:
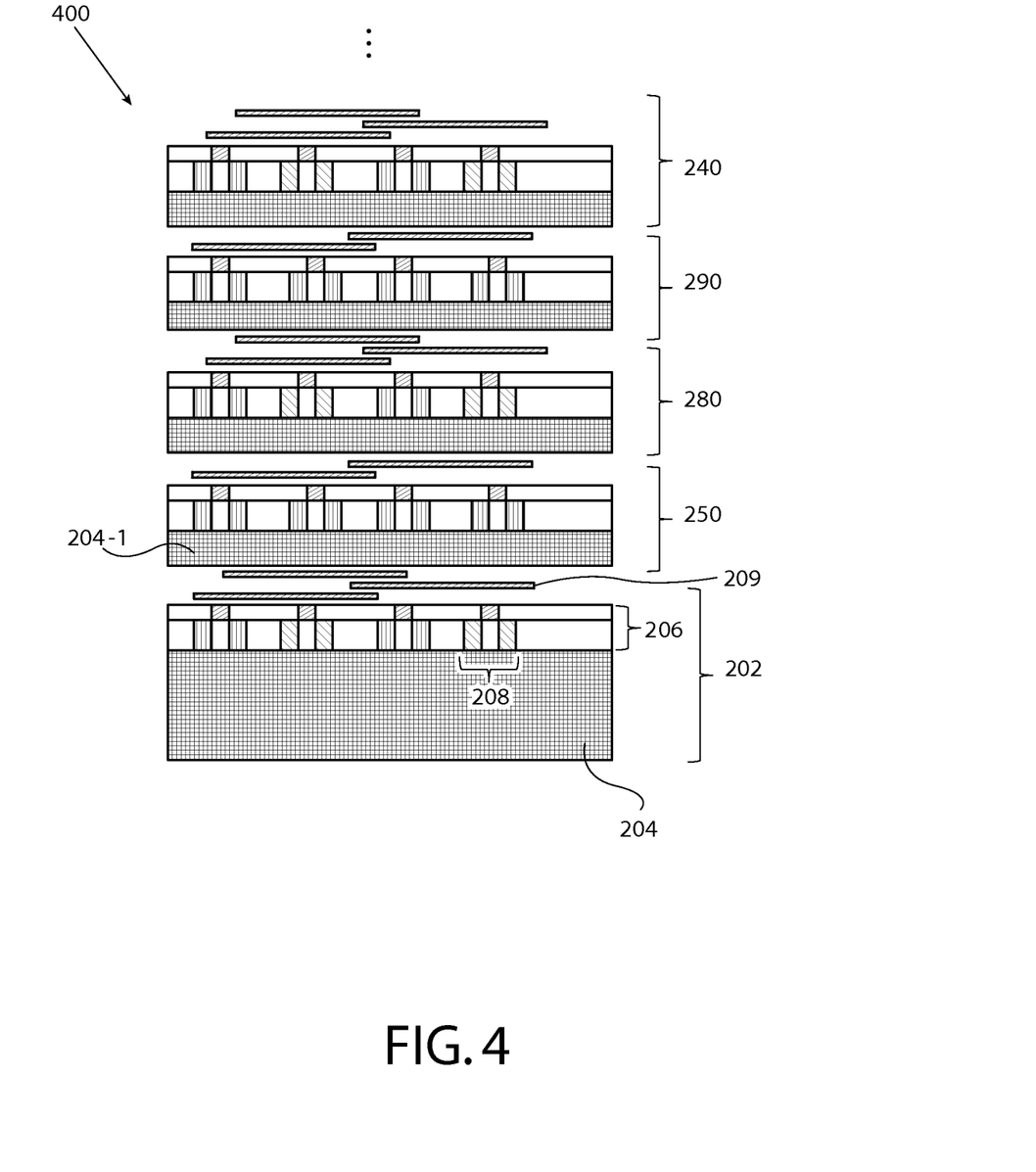
Figure 5A:
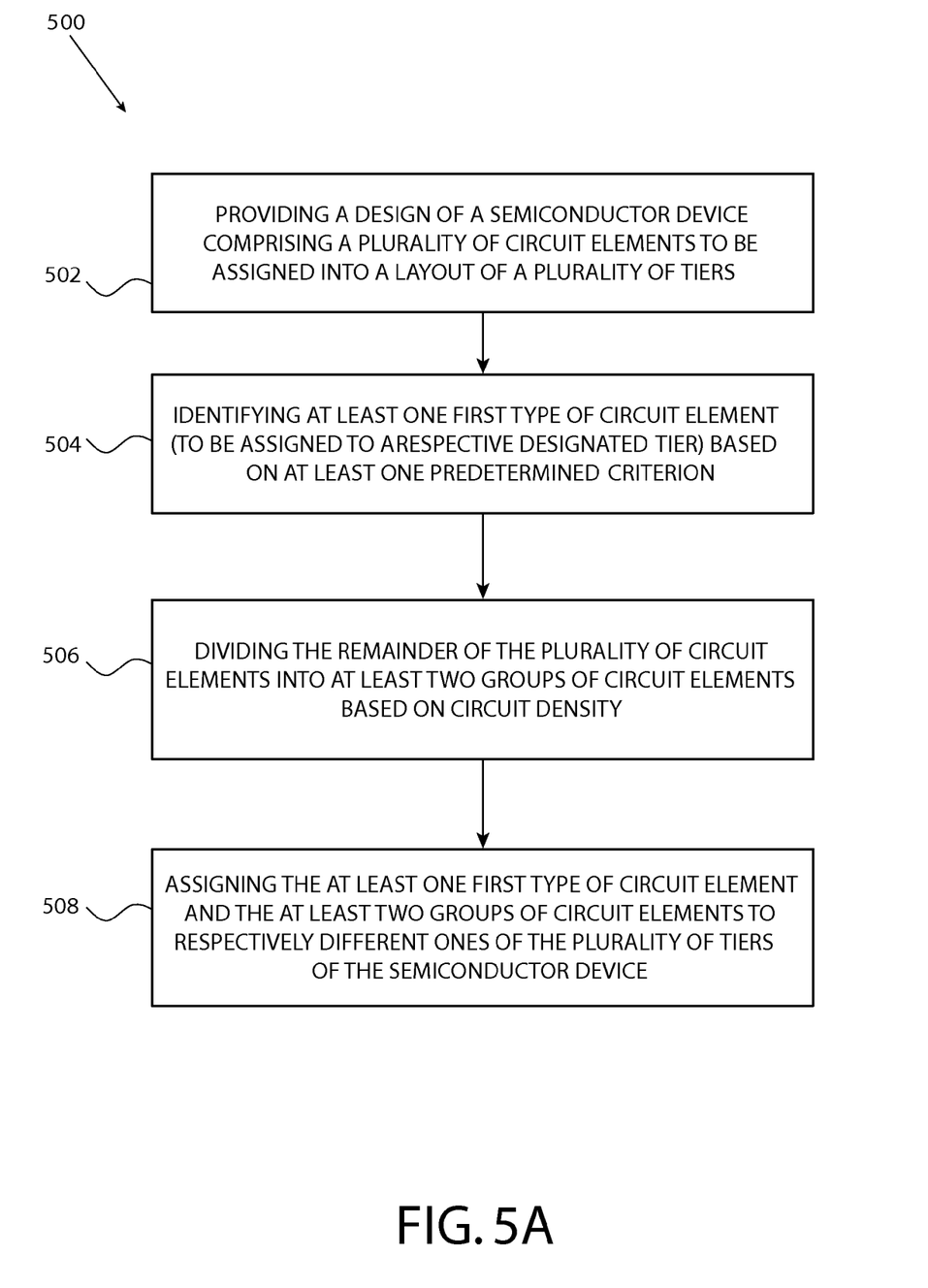
FIGS. 5A and 5B are flowcharts illustrating an exemplary method for designing layouts of a semiconductor device in accordance with some embodiments.
Figure 5B:
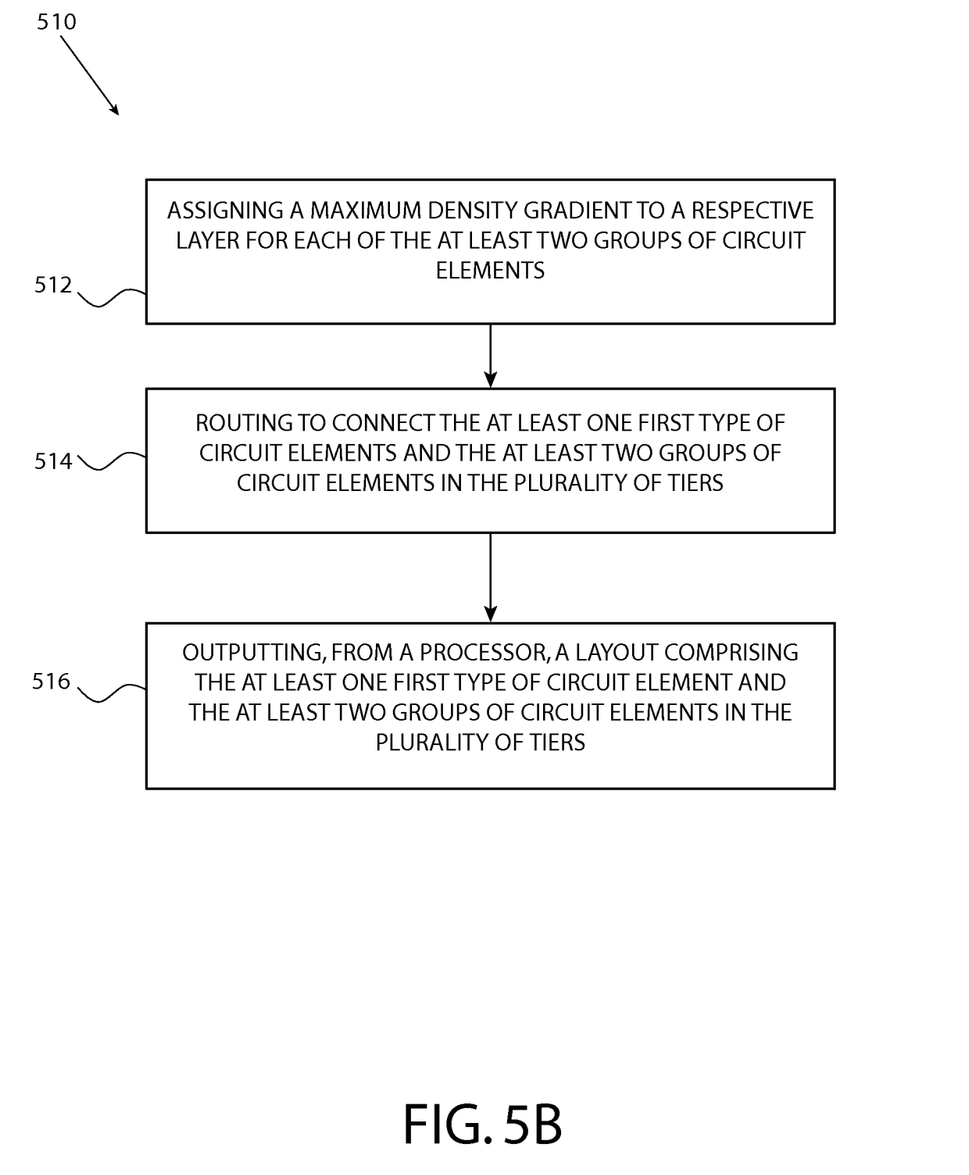

FIGS. 2-4 illustrate exemplary three-dimensional layouts of three stacked CMOS devices following one or more steps of the method of FIGS. 5A-5B. In FIGS. 2-4, like items are indicated by like reference numerals, and for brevity, descriptions of the structure, provided above with reference to the proceeding figures, are not repeated. FIGS. 2-4 are for the purpose of illustration purpose only, and do not limit the applications of the methods described herein. The detailed structures of a semiconductor device as such inter-level vias (ILVs) in stacked CMOS device or through silicon vias (TSVs) in a general 3D-IC device are not shown. The methods shown in FIGS. 5A-5B are described with reference to the exemplary structure described in FIGS. 2-4.

FIG. 2 illustrates one exemplary layout 200 of a stacked CMOS device having the at least one first type of circuit element in separate tiers (or layers) 220 and 230. As illustrated in FIG. 2, a stacked CMOS device of layout 200 comprises a base tier 202, and other tiers 210-240 above the base tier 202. Each tier can include a semiconductor substrate 204 or a semiconductor material layer 204-1, a circuit element layer 206 comprising circuit elements 208 (such as CMOS transistors, diodes, and/or MOS capacitors) and conductive lines 209. The semiconductor material layer 204-1 in other tiers 210-240 above the base tier 202 is thinner than the semiconductor substrate 204 in the base tier 202 in some embodiments. Nevertheless, in some embodiments, any or all of the semiconductor material layers 204-1 can include transistors, diodes or MOS capacitors. In some embodiments, the thickness of the base tier 202 is in the range of from 1 micron to 10 microns, for example, 5 microns. The thickness of each of the semiconductor material layers 204-1 is in the range of from 10 nanometers to 500 nanometers, for example, about 100 nanometers.

In layout 200, at least one first type of circuit element includes bandgap circuit elements in tier 220 and video digital-to-analog converter (vDAC) circuit elements in tier 230. The bandgap circuit elements in tier 220 and vDAC circuit elements in tier 230 can have similar circuit density, for example, in the range of from 40% to 50%. However, these two types of circuit elements are made using different processes in some embodiments.

In layout 200, circuit elements having intermediate level of circuit density, for example, in the range of from 15% to 30%, are assigned to tier 210. Examples of such circuit elements having an intermediate level of circuit density include but are not limited to digital circuits. Circuit elements having maximum level of circuit density, for example, in the range higher than 50%, are assigned to tier 240. Examples of such circuit elements having maximum level of circuit density includes but are not limited to decoupling capacitor circuits, which can have a circuit density as high as 60%.

FIG. 3 illustrates one exemplary layout 300 of a stacked CMOS device having the at least four types of circuit element in separate tiers based on different circuit density ranges. As illustrated in FIG. 3, a stacked CMOS device of layout 300 comprises a base tier 202 as described in FIG. 2, and other tiers 250-270 and 240 above the base tier 202.

In layout 300, circuit elements of the first group having low level of circuit density (e.g., in the range of from 0.1% to 10%), are assigned to tier 250. Examples of such circuit elements having low circuit density include but are not limited to Hi-R resistors. Circuit elements of the second group having intermediate circuit density (e.g., in the range from 15% to 30%) are assigned to tier 260. Examples of such circuit elements having intermediate circuit density include but are not limited to digital circuit.

In layout 300, circuit elements of the third group having medium high circuit density (e.g., in the range of from 30.01% to 40%), for example, analog array circuits, are assigned to tier 270. Circuit elements having maximum level of circuit density (e.g., higher than 50.01%), for example, decoupling capacitor circuits, are assigned to tier 240.

FIG. 4 illustrates another exemplary layout 400 of a stacked CMOS device having the at least four types of circuit element in separate tiers based on different circuit density ranges and the corresponding maximum density gradient. As illustrated in FIG. 4, a stacked CMOS device of layout 400 comprises a base tier 202 as described in FIG. 2, and other tiers 250, 280-290 and 240 above the base tier 202.

In layout 400, circuit elements of the first group having low level of circuit density (e.g., in the range of from 0.1% to 10%), for example, Hi-R resistor circuits, are assigned to tier 250. The maximum circuit density is 10%. Circuit elements of the second group having medium high circuit density (e.g., in the range of from 30% to 40%), for example, switching pair circuits, are assigned to tier 280. The maximum circuit density gradient is 10%.

Circuit elements of the third group having high circuit density (e.g., in the range of from 45.01% to 50%), for example, tail current circuits, are assigned to tier 290. The maximum circuit density gradient is 5%. Circuit elements having maximum level of circuit density (e.g., in the range from 50.01% to 60%), for example, decoupling capacitor circuits, are assigned to tier 240. The maximum circuit density gradient is 10%.

FIGS. 5A-5B illustrates an exemplary method 500/510 for designing layouts of a semiconductor device in accordance with some embodiments.

Referring to FIG. 5A, at step 502, a design of a semiconductor device is provided. The design of the semiconductor device comprises a plurality of circuit elements to be assigned into a layout of a plurality of tiers. The semiconductor device is a device comprising a stacked complementary metal-oxide-semiconductor (CMOS) structure in some embodiments. In other embodiments, the semiconductor device is a device comprising a three-dimensional integrated circuit (3D-IC) structure.

At step 504, at least one first type of circuit element within the plurality of circuit elements is identified based on at least one predetermined criterion. The at least one first type of circuit element has a high precision or matching specification. Examples of the at least one first type of circuit element include but are not limited to a bandgap circuit or a video digital-to-analog converter (vDAC) circuit. The at least one first type of circuit element can have a moderate circuit density, for example, in the range of from 40% to 50%.

As the most significant circuit elements, each respective type of the at least one first type of circuit element is to be assigned to a respective designated one of the plurality of tiers. In some embodiments, one type of the at least one first type of circuit element is to be assigned to a respective tier so that the respective tier has a fixed circuit density with no gradient of circuit density. Each respective type of the at least one first type of circuit element can be arranged in a respective single tier in array-type layout in some embodiments. As described below in FIG. 2, in one exemplary layout 200 of a stacked CMOS device, the at least one first types of circuit element includes two types of circuit elements, in respectively separate tiers 220 and 230. The at least one first type of circuit element includes bandgap circuit elements in tier 220 and vDAC circuit elements in tier 230.

At step 506, the remainder of the plurality of circuit elements is divided into at least two groups of circuit elements based on circuit density.

In some embodiments, in the step of dividing the remainder of the plurality of circuit elements into at least two groups of circuit elements based on circuit density, the remainder of the plurality of circuit elements are divided based on ranges of circuit density comprising: the first, the second and the third groups. The second group has a circuit density higher than that of the first group. The third group has a circuit density higher than that of the second group. For example, the first group has low circuit density (e.g., in the range of from 0.1% to 10%). The second group has intermediate circuit density (e.g., in the range of from 10.01% to 30%). The third group has high circuit density (e.g., in the range of from 30.01% to 50%). The circuit density is at least one of a density of polysilicon and a density of active regions. In some embodiments, the circuit density includes both a density of polysilicon and a density of active regions.

In some embodiments, the remainder of the plurality of circuit elements is divided based on ranges of circuit density comprising: the first, the second, the third and the fourth groups, in the order of increasing circuit density. For example, the first group has low circuit density (e.g., in the range of from 0.1% to 10%). The second group has intermediate circuit density (e.g., in the range of from 10.01% to 30%). The third group has high circuit density (e.g., in the range of from 30.01% to 50%). The fourth group has a "maximum" circuit density (e.g., higher than 50.01%).

The remainder of the plurality of circuit elements can also be divided into a plurality of groups based on a series of predetermined circuit density values or ranges. For example, each of a series of circuit density ranges can be selected from a group consisting of from 0 to 10%, from 10.01% to 20%, from 20.01% to 30%, from 30.01% to 40%, from 40.01% to 50%, and higher than 50.01%. These ranges are not overlapping in some embodiments, and can be overlapping in some other embodiments.

At step 508, the at least one first type of circuit element and the at least two groups of circuit elements are assigned to respectively different ones of the plurality of tiers of the semiconductor device. One of the at least one first type of circuit element is assigned to a respective tier so that the respective tier has a fixed circuit density with no gradient of circuit density between regions of at least a given size. Each of the at least two groups of circuit elements is assigned to respectively different ones of the plurality of tiers based on predetermined circuit density values or ranges as selected at step 506. As described in FIG. 2, layout 200 illustrates a stacked CMOS device having the at least one first type of circuit element in separate tiers 220 and 230.

Assignment of at least one first type of circuit element to a respective tier can be performed at step 508 or in a separate step after step 504.

Referring to FIG. 5B, at step 512, a maximum density gradient is assigned to a respective tier for each of the at least two groups of circuit elements. Step 512 can be combined with step 508 in some embodiments.

The maximum density gradient assigned for each tier depends on the types of circuits, and can be any preselected number. For example, the maximum density gradient assigned for one tier can be selected from a group including 5%, 10%, 15% or 20% based on types of circuit elements. The maximum density gradient of 10% is used in some embodiments. In a tier comprising significant circuits, the maximum density gradient of 5% can be used. Examples of significant circuits include but are not limited to serializer/deserializer (SerDes) circuits. In a tier comprising low speed or other noncritical circuits such as Hi-R resistor, a maximum circuit density gradient of 15% or even 20% can be used.

In some embodiments, the maximum density gradient between two regions of at least a given size for a tier assigned to a first group having low circuit density can be 20%. The circuit density for the first group can be in the range of from 0.1% to 20%. The circuit elements of the first group include circuits for low speed or any other noncritical applications. Examples of the circuits of the first group include but are not limited to Hi-R resistor.

The maximum density gradient between two regions of at least a given size for a tier assigned to the second group having intermediate circuit density can be 10% in some embodiments. The circuit density ranges from 20.01% to 30%. Examples of the second group of circuits include but are not limited to parallel-in serial-out (PISO) circuits. Similarly, the maximum density gradient between two regions of at least a given size for a tier assigned to the third group is 5%, with a circuit density in the range of from 30.01% to 35%. Examples of a circuit having 5% of maximum density gradient include but are not limited to a high precision current mirror circuit.

The maximum density gradient between two regions of at least a given size for a tier assigned to the fourth group is 10%, with a circuit density in the range of from 35.01% to 45%. Examples of the fourth group of circuits include but are not limited to current mode logic (CML) differential pair circuits. The fifth group can have a maximum density gradient of 5% in the range of from 45.01% to 50%. Examples of the circuits of the fifth group include but are not limited to tail current circuit. The sixth group can have a circuit density in the range of from 50.01% to 60% with a maximum density gradient of 10%. Examples of the circuits in the sixth group include but are not limited to decoupling capacitor circuits. Any two or more of these groups can be combined in some embodiments.

As described in FIG. 3, layout 300 illustrates a stacked CMOS device having the at least four types of circuit elements in separate tiers based on different circuit density ranges. As described in FIG. 4, layout 400 illustrates a stacked CMOS device having the at least four types of circuit elements in separate tiers based on different circuit density ranges and the corresponding maximum density gradient.

A circuit density gradient between two adjacent tiers can exist in some embodiments. A circuit density gradient between two adjacent tiers may not be limited to any maximum value in some embodiments. A circuit density gradient can also exist in the base tier 202 in some embodiments. Circuit elements of different circuit density ranges can co-exist in the base tier 202.

Reference is again made to FIG. 5B. At step 514, routing is performed to connect the at least one first type of circuit elements and the at least two groups of circuit elements in the plurality of tiers, through inter-level vias and/or other conductive lines. The at least one first type of circuit elements and the at least two groups of circuit elements are assigned to a plurality of tiers based on circuit density, a maximum density gradient assigned to a respective tier, desired signal or power integrity, or a combination thereof. For example, shortest significant paths and lowest capacitance are considered to achieve desired signal or power integrity. In some embodiments, dummy circuits are not needed in the three-dimensional layout. The physical dimensions of significant blocks are reduced. Both speed and power of the resulting device are improved.

At step 518, a layout is output from the processor. The layout, such as layout 200, 300 or 400, comprises the at least one first type of circuit element and the at least two groups of circuit elements in the plurality of tiers.

Figure 6:
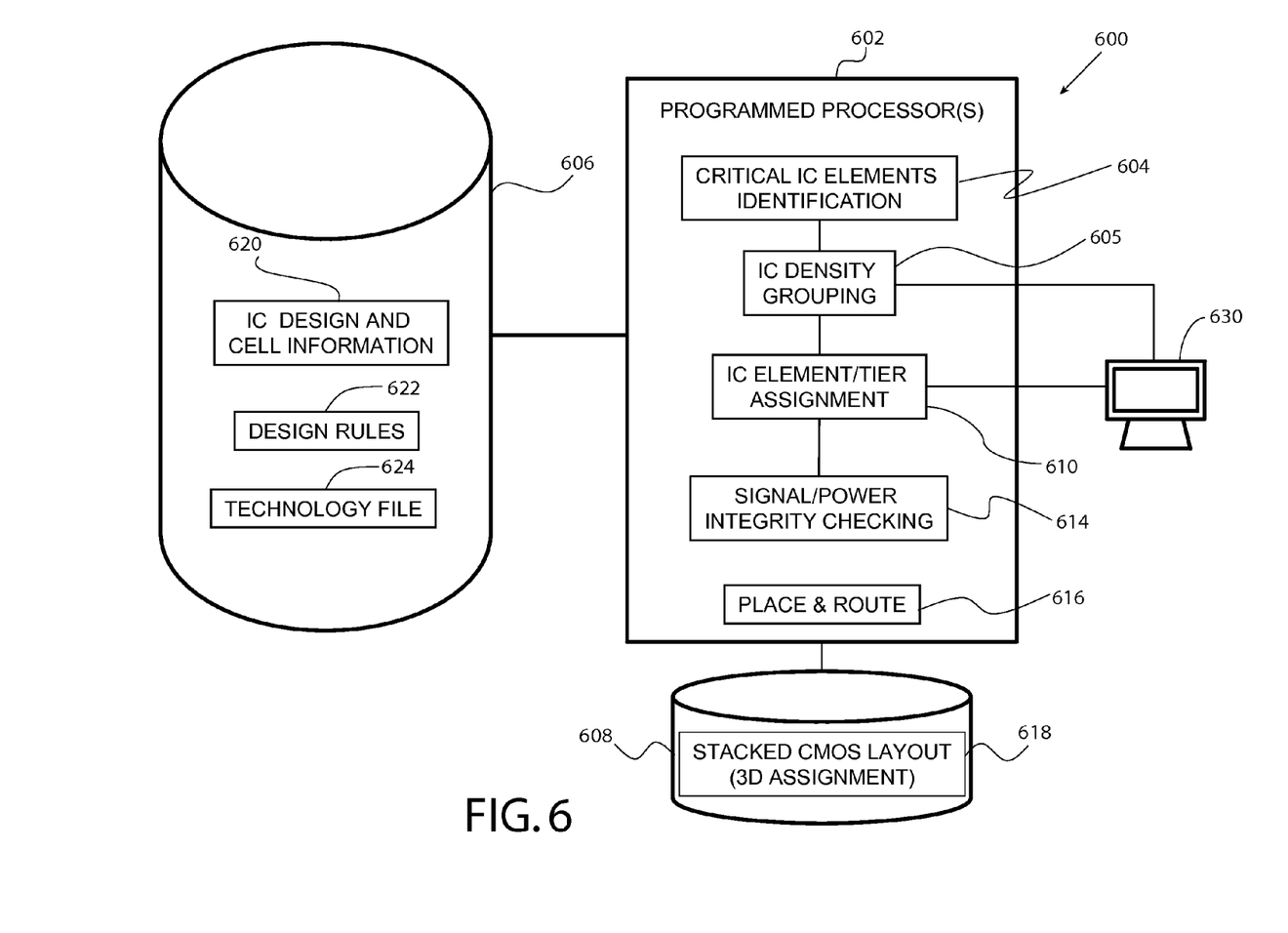
FIG. 6 is a block diagram of an embodiment of a system for performing a method as described herein.

FIG. 6 is a block diagram 600 of an embodiment of a system for performing a method 500/510 as described herein.

System 600 comprises at least a non-transitory, machine readable storage medium 606, and a processor 602 coupled to access the storage medium 606. The storage medium 606 is encoded with data representing a design of a semiconductor device such as a stacked CMOS device. The design of a semiconductor device comprises a plurality of circuit elements to be assigned into a layout of a plurality of tiers. The processor 602 is programmed to perform a method as described above.

Referring to FIG. 6, processor 602 indicates that one or more programmed processors may be included. In some embodiments, the processing load is performed by two or more application programs, each operating on a separate processor. In other embodiments, the processes are all performed using one processor. Similarly, two media 606 and 608 are shown, but the data may be stored in any number of media. Although FIG. 6 shows an allocation of the various tasks to specific modules, this is only one example. The various tasks may be assigned to different modules to improve performance, or improve the ease of programming.

System 600 includes an electronic design automation ("EDA") tool such as "IC COMPILER"™, sold by Synopsys, Inc. of Mountain View, Calif., which may include a place and route tool 616, such as "ZROUTE"™, also sold by Synopsys. Other EDA tools may be used, such as the "VIRTUOSO" custom design platform or the Cadence "ENCOUNTER"® digital IC design platform may be used, along with the "VIRTUOSO" chip assembly router 616, all sold by Cadence Design Systems, Inc. of San Jose, Calif.

The EDA tool is a special purpose computer formed by retrieving stored program instructions from a non-transient computer readable storage medium 606 and executing the instructions on a general purpose processor 602. Thus, the instructions configure the logic circuits of the processor 602 to function as an EDA tool. Examples of non-transient computer readable storage mediums 606, 608 include, but are not limited to, hard disk drives (HDD), read only memories ("ROMs"), random access memories ("RAMs"), flash memories, or the like. Tangible, non-transient machine readable storage mediums 606, 608 are configured to store data generated by the place and route tool 616.

The router of the place and route tool 616 is capable of receiving an identification of a plurality of patterns to be included in an integrated circuit ("IC"). Router 616 may be equipped with a set of default design rules 622 and technology file 624.

In processor 602, different modules are configured to perform a method as described above. For example, module 604 is configured to identify significant circuit elements such as the at least one first type of the circuit element as described in step 504. Module 605 is programmed to perform dividing the remainder of circuit elements into different group based on circuit density as described in step 506. Module 610 is configured to perform assigning different groups of circuit elements into different tiers as described in steps 508 and 512. Module 614 is programmed to perform checking signal and power integrity as described at step 514. The circuit elements in different tiers are routed in module 616.

A graphical interface facilitates the design process by displaying the layout from processor 602. In some embodiments, a display 630 displays a graphical representation of the layout, and assists the user in layout design decisions. The layout of a semiconductor device such as a device comprising a stacked CMOS structure is stored in a non-transitory machine readable storage medium 608.

This present disclosure provides a method and a system for designing layout in a semiconductor device such as a stack CMOS device or a 3D-IC device. The method comprises providing a design of a semiconductor device comprising a plurality of circuit elements to be assigned into a layout of a plurality of tiers (or layers), and identifying at least one first type of circuit element within the plurality of circuit elements, based on at least one predetermined criterion. Each respective one of the at least one first type of circuit element to be assigned to a respective designated one of the plurality of tiers. The method further comprises dividing the remainder of the plurality of circuit elements into at least two groups of circuit elements based on circuit density, and assigning the at least one first type of circuit element and the at least two groups of circuit elements to respectively different ones of the plurality of tiers of the semiconductor device.

The semiconductor device is a device comprising a stacked complementary metal-oxide-semiconductor (CMOS) structure in some embodiments. The semiconductor device is a device comprising a three-dimensional integrated circuit (3D-IC) structure in some embodiments. The circuit density is at least one of a density of polysilicon and a density of active regions. The density of polysilicon is defined by a percentage of areas of polysilicon occupied in a unit area of a respective tier. The density of active regions is defined by a percentage of active regions occupied in a unit area of a respective tier.

In some embodiments, one of the at least one first type of circuit element is assigned to a respective tier so that the respective tier has a fixed circuit density with no gradient of circuit density. In some embodiments, in the step of dividing the remainder of the plurality of circuit elements into at least two groups of circuit elements based on circuit density, the remainder of the plurality of circuit elements are divided based on ranges of circuit density comprising: the first, the second and the third groups. The second group has a circuit density higher than that of the first group. The third group has a circuit density higher than that of the second group.

In some embodiments, the method further comprises assigning a maximum density gradient to a respective tier for each of the at least two groups of circuit elements. In some embodiments, the at least one first type of circuit elements and the at least two groups of circuit elements are assigned to a plurality of tiers based on circuit density, a maximum density gradient assigned to a respective tier, and desired signal or power integrity.

In some embodiments, the method further comprises routing to connect the at least one first type of circuit elements and the at least two groups of circuit elements in the plurality of tiers. The method can further comprises outputting from a processor a layout comprising the at least one first type of circuit element and the at least two groups of circuit elements in the plurality of tiers.

The present disclosure also provides a method for designing layout of a stacked CMOS device. The method comprises providing a design of a stacked CMOS device comprising a plurality of circuit elements to be assigned into a layout of a plurality of tiers, identifying at least one first type of circuit element within the plurality of circuit elements based on at least one predetermined criterion, and assigning each respective one of the at least one first type of the circuit elements to a respective designated tier. The method further comprises dividing the remainder of the plurality of circuit elements into at least two groups of circuit elements based on circuit density, assigning a maximum density gradient to a respective tier for each of the at least two groups of circuit elements based on types of circuit elements, and assigning the at least two groups of circuit elements to respectively different ones of the plurality of tiers in the semiconductor device.

In some embodiments, the circuit density is at least one of a density of polysilicon and a density of active regions as defined above. The maximum density gradient assigned to a respective tier for each of the at least two groups of circuit elements can be a predetermined number. For example, the maximum density gradient is selected from the group consisting of 5%, 10%, 15% and 20% in some embodiments. In some embodiments, the at least one first type of circuit elements and the at least two groups of circuit elements are assigned to a plurality of tiers based on circuit density, a maximum density gradient assigned to a respective tier, and desired signal or power integrity.

In some embodiments, the method further comprises routing to connect the at least one first type of circuit elements and the at least two groups of circuit elements in the plurality of tiers, and outputting, from a processor, a layout comprising the at least one first type of circuit elements and the at least two groups of circuit elements in the plurality of tiers.

In another aspect, the present disclosure provides a system. The system comprises a non-transitory, machine readable storage medium, and a processor. The non-transitory, machine readable storage medium is encoded with data representing a design of a semiconductor device comprising a plurality of circuit elements to be assigned into a layout of a plurality of tiers. The processor is coupled to access the storage medium, and is programmed to perform a method as described above. In some embodiments, the layout is of a semiconductor device comprising a stacked CMOS structure.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, or any combination of these mediums, wherein, when the computer program code is loaded into and executed by a computer, the computer becomes an apparatus for practicing the method. The methods may also be at least partially embodied in the form of a computer into which computer program code is loaded and/or executed, such that, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
   providing a design of a semiconductor device comprising a plurality of circuit elements to be assigned into a layout of a plurality of tiers;
   identifying at least one first type of circuit element within the plurality of circuit elements, based on at least one predetermined criterion;
   dividing the remainder of the plurality of circuit elements into at least two groups of circuit elements based on circuit density;
   assigning a maximum density gradient to a respective tier for each of the at least two groups of circuit elements; and
   assigning the at least one first type of circuit element and the at least two groups of circuit elements to respectively different ones of the plurality of tiers of the semiconductor device.

2. The method of claim 1, wherein the semiconductor device is a device comprising a stacked complementary metal-oxide-semiconductor (CMOS) structure.

3. The method of claim 1, wherein the semiconductor device is a device comprising a three-dimensional integrated circuit (3D-IC) structure.

4. The method of claim 1, wherein the circuit density is at least one of a density of polysilicon and a density of active regions, the density of polysilicon defined by a percentage of areas of polysilicon occupied in a unit area of a respective tier, the density of active regions defined by a percentage of active regions occupied in a unit area of a respective tier.

5. The method of claim 1, wherein one of the at least one first type of circuit element is assigned to a respective tier so that the respective tier has a fixed circuit density with no gradient of circuit density.

6. The method of claim 1, wherein in the step of dividing the remainder of the plurality of circuit elements into at least two groups of circuit elements based on circuit density, the remainder of the plurality of circuit elements are divided based on ranges of circuit density comprising: the first, the second and the third groups, where the second group has a circuit density higher than that of the first group, and the third group has a circuit density higher than that of the second group.

7. The method of claim 1, wherein the at least one first type of circuit elements and the at least two groups of circuit elements are assigned to a plurality of tiers based on circuit density, a maximum density gradient assigned to a respective tier, and desired signal or power integrity.

8. The method of claim 1, further comprising
   routing to connect the at least one first type of circuit elements and the at least two groups of circuit elements in the plurality of tiers.

9. The method of claim 1, further comprising
outputting, from a processor, a layout comprising the at least one first type of circuit element and the at least two groups of circuit elements in the plurality of tiers.

10. A method comprising:
providing a design of a stacked CMOS device comprising a plurality of circuit elements to be assigned into a layout of a plurality of tiers;
identifying at least one first type of circuit element within the plurality of circuit elements, based on at least one predetermined criterion;
assigning each respective one of the at least one first type of the circuit elements to a respective designated tier;
dividing the remainder of the plurality of circuit elements into at least two groups of circuit elements based on circuit density;
assigning a maximum density gradient to a respective tier for each of the at least two groups of circuit elements based on types of circuit elements; and
assigning the at least two groups of circuit elements to respectively different ones of the plurality of tiers in the semiconductor device.

11. The method of claim 10, wherein the circuit density is at least one of a density of polysilicon and a density of active regions, the density of polysilicon defined by a percentage of areas of polysilicon occupied in a unit area of a respective tier, the density of active regions defined by a percentage of active regions occupied in a unit area of a respective tier.

12. The method of claim 10, wherein the maximum density gradient assigned to a respective tier for each of the at least two groups of circuit elements is selected from the group consisting of 5%, 10%, 15% and 20%.

13. The method of claim 10, wherein the at least one first type of circuit elements and the at least two groups of circuit elements are assigned to a plurality of tiers based on circuit density, a maximum density gradient assigned to a respective tier, and desired signal or power integrity.

14. The method of claim 10, further comprising
routing to connect the at least one first type of circuit elements and the at least two groups of circuit elements in the plurality of tiers; and
outputting, from a processor, a layout comprising the at least one first type of circuit elements and the at least two groups of circuit elements in the plurality of tiers.

15. A system, comprising:
a non-transitory, machine readable storage medium encoded with data representing a design of a semiconductor device comprising a plurality of circuit elements to be assigned into a layout of a plurality of tiers; and
a processor coupled to access the storage medium, the processor programmed to perform a method comprising:
identifying at least one first type of circuit element within the plurality of circuit elements, based on at least one predetermined criterion;
dividing the remainder of the plurality of circuit elements into at least two groups of circuit elements based on circuit density;
assigning a maximum density gradient to a respective tier for each of the at least two groups of circuit elements; and
assigning the at least one first type of circuit element and the at least two groups of circuit elements to respectively different ones of the plurality of tiers of the semiconductor device.

16. The system of claim 15, wherein the circuit density is at least one of a density of polysilicon and a density of active regions, the density of polysilicon defined by a percentage of areas of polysilicon occupied in a unit area of a respective tier, the density of active regions defined by a percentage of active regions occupied in a unit area of a respective tier.

17. The system of claim 15, wherein the processor is configured to perform the method further comprising:
routing to connect the at least one first type of circuit elements and the at least two groups of circuit elements in the plurality of tiers; and
outputting a layout comprising the at least one first type of circuit elements and the at least two groups of circuit elements in the plurality of tiers.

18. The system of claim 15, wherein the layout is of a semiconductor device comprising a stacked CMOS structure.

19. The method of claim 1, wherein the at least two groups of circuit elements are assigned to respectively different ones of the plurality of tiers of the semiconductor device so as to comply to the maximum density gradient assigned to the respective tier for each of the at least two groups of circuit elements.

20. The method of claim 1, wherein the at least one first type of circuit element identified based on the at least one predetermined criterion has a fixed circuit density.

* * * * *